United States Patent [19]

Epstein

[11] 3,760,290

[45] Sept. 18, 1973

[54] CRYSTAL CONTROLLED VARIABLE FREQUENCY OSCILLATOR

[75] Inventor: Philip L. Epstein, Elizabeth, N.J.

[73] Assignee: Quinder Electronics, Inc., Springfield, N.J.

[22] Filed: June 16, 1972

[21] Appl. No.: 263,542

[52] U.S. Cl. ........................ 331/40, 331/41, 331/42

[51] Int. Cl. ........................................ H03b 21/00

[58] Field of Search .................. 331/37, 40, 42, 43, 331/48

[56] References Cited

UNITED STATES PATENTS 3,378,774 4/1968 Leypold .............................. 331/40

*Primary Examiner*—John Kominski
*Attorney*—Gerald Altman et al.

[57] ABSTRACT

A crystal oscillator frequency and a shift oscillator frequency are selectively combined in a PUT and TAKE circuit comprising digital dividers and logic gating for generating an output signal at a center frequency, at a high frequency and at a low frequency. The center frequency is governed by the crystal oscillator, the high and low frequencies are determined by the center frequency plus and minus the shift frequency of the shift oscillator.

10 Claims, 2 Drawing Figures

CRYSTAL CONTROLLED VARIABLE FREQUENCY OSCILLATOR

BACKGROUND OF THE INVENTION

1. Field of Invention

The present invention relates to frequency generating devices and, more particularly, is directed towards a crystal controlled variable frequency oscillator.

2. Description of the Prior Art

One important consideration in communications technology is the frequency stability of oscillators. Excellent frequency stability is available in systems requiring a single frequency by means of a crystal controlled oscillator. However, such frequency stability is not easily obtained in systems which require variable frequency signals. Great sums of capital and energy have been expended in developing systems which employ variable frequency oscillators. This expended effort has resulted in variable frequency oscillator schemes which have not been entirely satisfactory for most phases of communications technology and suffer from the disadvantage of being unduly complex and costly. For example, one such complex system utilizes separate frequency dividers and frequency synthesizers employing phase locked loops.

SUMMARY OF THE INVENTION

It is an object of the present invention to provide a crystal controlled variable frequency oscillator which does not suffer from th heretofore mentioned disadvantages. The variable frequency oscillator provided by the present invention is characterized by a PUT and TAKE circuit which provides an output signal having excellent frequency stability. The PUT and TAKE circuit comprises digital dividers and logic gating for selectively combining a crystal oscillator frequency and a shift oscillator frequency and for generating a stable frequency output signal at a center frequency, at a high frequency, and at a low frequency. The center frequency is specified by the crystal oscillator. The high and low frequencies are determined by selectively adding and subtracting the shift frequency of the shift oscillator and the center frequency of the crystal oscillator. The combination of crystal oscillator, shift oscillator and PUT and TAKE circuit is such as to a simple and inexpensive crystal controlled variable frequency oscillator.

The invention accordingly comprises the device possessing the construction, combination of elements, and arrangement of parts that are exemplified in the following detailed disclosure, the scope of which will be indicated in the appended claims.

BRIEF DESCRIPTION OF THE DRAWINGS

For a fuller understanding of the nature and objects of the present invention, reference should be had to the following detailed description taken in connection with the accompanying drawings wherein.

DETAILED DESCRIPTION OF THE INVENTION

Figure 1:
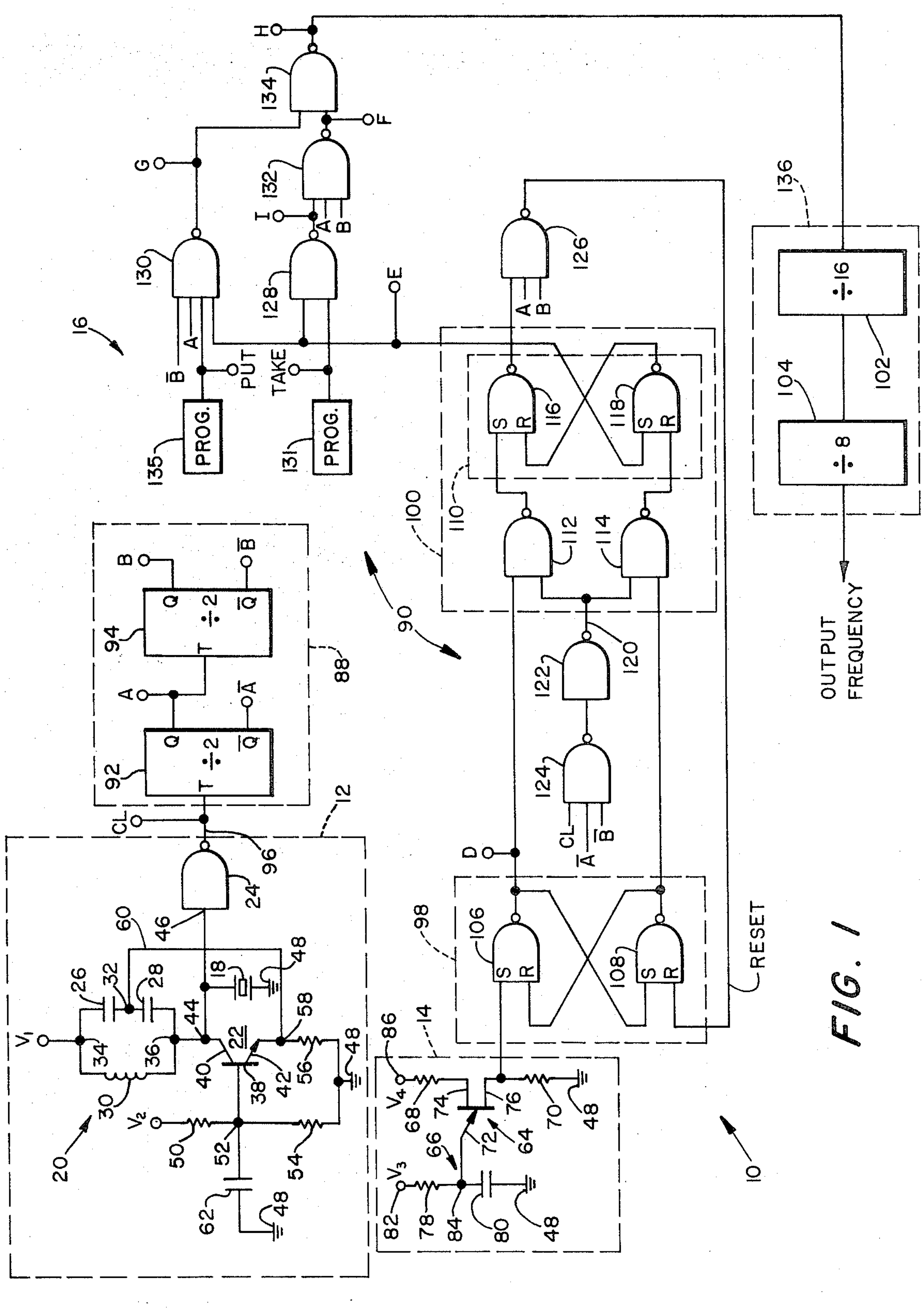
FIG. 1 is a schematic diagram of a crystal controlled variable frequency oscillator embodying the invention.

Referring now to the drawings, particularly FIG. 1, there is shown a variable crystal controlled oscillator 10 for generating an output signal characterized by excellent frequency stability. Variable crystal controlled oscillator 10 comprises a crystal oscillator 12, a shift oscillator 14 and a PUT and TAKE circuit 16.

Crystal oscillator 12 comprises a crystal 18, a tuned circuit 20, a semiconductor 22 and a NAND gate 24. Tuned circuit 20 includes series capacitors 26, 28 which are connected in parallel with an inductor 30, one side of capacitors 26 and 28 being joined at a junction 32. The other side of capacitor 26 is connected to one side of inductor 30 at a junction 34 which is adapted to receive a voltage $V_1$. The other side of capacitor 28 and the other side of inductor 30 are joined at a junction 36. Semiconductor 22, for example an NPN transistor, includes a base contact 38, a collector contact 40 and an emitter contact 42. Junction 36 and collector 40 are joined at a junction 44 which is further connected to an input terminal 46 of NAND gate 24. Crystal 18 is connected between junctions 44 and a return 48, for example a ground. A voltage $V_2$ is applied to base 38 through a resistor 50, base 38 and resistor 50 being joined at a junction 52 which is further connected to ground 48 through a resistor 54. Emitter 42 is connected to ground 48 via a resistor 56, the junction of emitter 42 and resistor 56 denoted by reference character 58. Junction 32 is tied to junction 58 by means of a line 60. A by-pass capacitor 62 is serially connected between junction 52 and ground 48.

Shift oscillator 14, for example a unijunction transistor oscillator, includes a unijunction transistor 64, RC network 66 and resistors 68, 70. By way of example, unijunction transistor 64 is a PN-N transistor having an emitter contact 72 and base contacts 74, 76. RC network 66, the oscillator time constants, includes a resistor 78 and a capacitor 80. One side of resistor 78 is connected to a terminal 82 which is adapted to receive a voltage $V_4$ and the other side of resistor 78 is joined to one side of capacitor 80 at a junction 84. The other side of capacitor 80 is connected to ground 48. Junction 84 is further connected to emitter contact 72. Resistor 68 is serially connected between base contact 74 and a terminal 86 which is adapted to receive a voltage $V_4$. Resistor 70 is serially connected between base contact 76 and ground 48. It is to be understood that, in alternative embodiments, the shift frequency is derived from crystal oscillator 12.

PUT and TAKE circuit 16 comprises a divider 88 and associated gating circuitry 90. In the illustrated embodiment, by way of example, divider 88 is a counter and includes flip-flops 92,94, each flip-flop having a trigger input terminal T and output terminals Q and $\bar{Q}$. For convenience, the signals presented at the Q and $\bar{Q}$ terminals of flip-flop 92 are denoted by the characters A and $\bar{A}$, respectively and the signals presented at the Q and $\bar{Q}$ terminals of flip-flops 94 are denoted by the characters B and $\bar{B}$. It is to be understood that A and B represent high logic levels, for example digital ones; and $\bar{A}$ and $\bar{B}$ represent low logical signals, for example digital zeros. A clock signal, CL, at an output terminal 96 of NAND gate 24 is applied to trigger input terminal T of flip-flop 92. The Q output terminal of flip-flop 92 is connected to the trigger input terminal T of flip-flop 94. In the preferred embodiment, by way of example, counter 88 is a divide by four counter, each flip-flop 92, 94 operating as a divide by two counter. It is to be understood that, in alternative embodiments, divider 88 is other than a counter, for example a shift register. The CL, A, A, B and B signals are processed in gating circuits 90 in the manner hereinafter described.

Gating circuitry 90 comprises a latch 98, a clocked NAND gate flip-flop 100, and dividers 102, 104. Latch 98 includes NAND gates 106 and 108, each NAND gate 106, 108 having a set terminal, a reset terminal and an output terminal; the set and reset terminals being denoted by the characters S and R respectively. The set terminal of NAND gate 106 is connected to base 76 of unijunction transistor 64 and the set terminal of NAND gate 108 is connected to the output terminal of NAND gate 106. The output terminals of NAND gates 106 and 108 are further connected to clocked NAND gate flip-flop 100.

Clocked NAND gate flip-flop 100 includes a latch 110 and NAND gates 112, 114. Latch 110 includes NAND gates 116, 118 each NAND gate 116, 118 having a set terminal, a reset terminal and an output terminal; the set and reset terminal being denoted by the characters S and R, respectively. The reset terminal of NAND gate 116 is connected to the output terminal of NAND gate 118. The set terminal of NAND gate 118 is connected to the output terminal of NAND gate 116. The output terminals of NAND gates 112 and 114, for example two input terinal NAND gates, are connected respectively to the set terminal of NAND gate 116 and the reset terminal of NAND gate 118. One of the input terminals of NAND gates 112 and 114 is tied to a common trigger line 120. The other input terminal of each NAND gates 112 and 114 is connected to the output terminal of each NAND gates 106 and 108, respectively. Common trigger line 120 is connected to an output terminal of a NAND gate 122. An input terminal of NAND gate 122 is connected to an output terminal of a three input terminal NAND gate 124. The $\bar{A}$, $\bar{B}$ and CL signals are applied to the three input terminals of NAND gate 124, one signal being applied to one input terminal thereof. The output terminal of NAND gate 116 is connected to one input of NAND gates 126, 128, and 130.

NAND gate 126, for example a three input terminal NAND, receives the A and B signals at its other two input terminals. The output terminal of NAND gate 126 is connected to the reset terminal of NAND gate 108. NAND gate 128, for example a two input terminal NAND gate, receives a TAKE signal generated by a programmer 131 on its second input terminal. An output terminal of NAND gate 128 is connected to one input terminal of a three input terminal NAND gate 132, the A and B signals being applied to the other two input terminals. The output terminal of NAND gate 132 is tied to one input terminal of a two input terminal NAND gate 134. The other input terminal of NAND gate 134 is connected to the output terminal of NAND gate 130, for example a four input terminal NAND gate. A PUT signal generated by a programmer 135 and the A and B signals are applied to the three free input terminals of NAND gate 130. The output terminal of NAND gate 134 is connected to an input terminal divider 102, for example a divide by sixteen counter. An output terminal of divider 102 is connected to an input terminal of divider 104, for example, a divide by eight counter. An output signal of of crystal controlled variable frequency oscillator 10 is presented at an output terminal of divider 104.

MODES OF OPERATION

Figure 2:
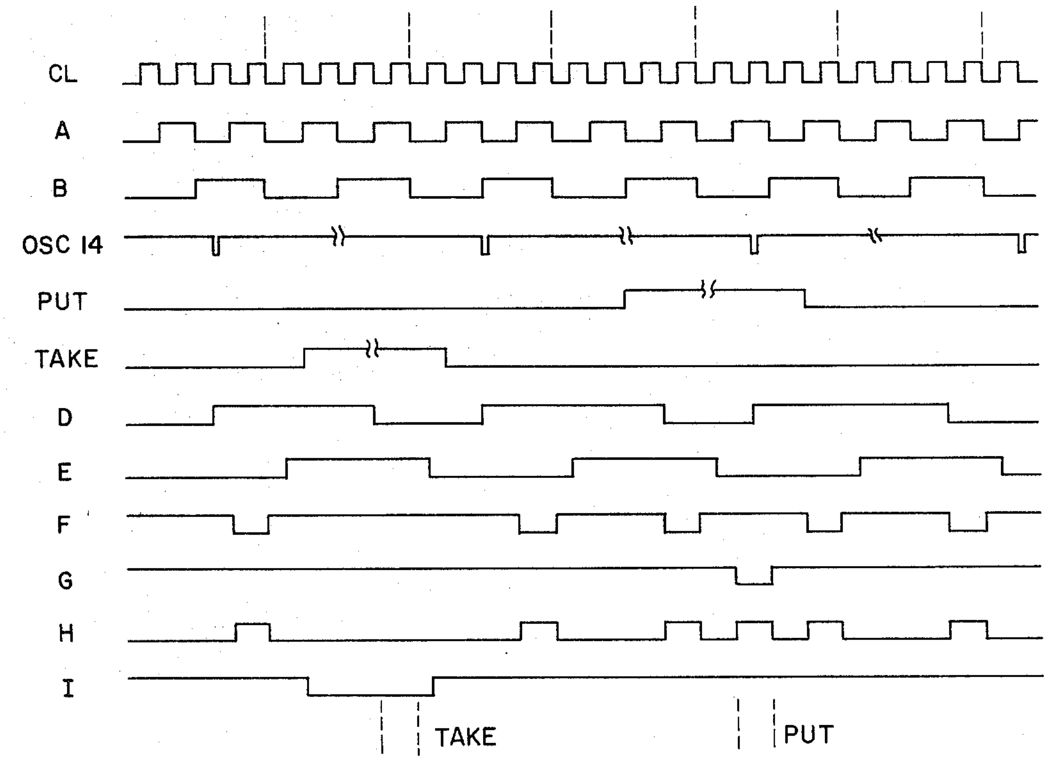
FIG. 2 is a graphical representation of the various waveforms of the crystal controlled variable frequency oscillator of FIG. 1.

In the illustrated embodiment, by way of example, crystal oscillator 12 is running at a frequency 512 times faster than the center frequency and unijunction oscillator 14 is running asynchronously with crystal oscillator 12 at a frequency 128 times the shift frequency. Divide by 4 counter 88 and associated gating 90 selectively combine the center and shift frequency, dividers 102 and 106 operate as a divide by 128 counter 136 for generating the output frequency. In the following discussion, reference should be made to the waveforms presented in FIG. 2.

1. Center frequency - PUT and TAKE signals are low

The signal at output terminal 96 of crystal oscillator 12, denoted by CL, is divided by 4 in counter 88. The A and B output signals of counter 88 are applied to NAND gates 132 and 134, the signal at the output terminals of NAND gates 132 and 134 being denoted by the alphanumeric characters F and H, respectively. The H signal, which is the frequency of crystal oscillator 12 divided by four, is divided by 128 in counter 136. The signal at the output terminal of counter 136 is the crystal frequency divided by 512 which is the center frequency.

2. High frequency - PUT signal is high and TAKE signal is low

Latch 98 is set by a pulse generated by unijunction oscillator 14. The signals at the output terminal of latch 98 are gated with $\bar{A}$, $\bar{B}$ and CL signals to set latch 110. The signals as at the output of latch 110, denoted by alphanumeric character E, is gated with A, B and the PUT signal in NAND gate 130, the G signal at the output of NAND gate 130 being fed to NAND gate 134 for generating an extra pulse into counter 102. The E signal at the output of latch 110 is gated also with A and B in NAND gate 126; the signal at the output of NAND gate 126 operating to reset latch 98. This cycle is repeated for every pulse generated by unijunction oscillator 14. NAND gate 134 generates an output signal for each fourth pulse of crystal oscillator 12 and for each pulse of unijunction oscillator 14. The signal at the output terminal of NAND gate 134 is divided by 128 in counter 136. The signal as at the output terminal of counter 136 is the high frequency which is the sum of shift frequency divided by 128 plus the center frequency.

3. Low frequency - PUT signal is low and TAKE signal is high

Latch 98 is set by a pulse generated by unijunction oscillator 14. The signals at the output of latch 98 are gated with $\bar{A}$, $\bar{B}$ and CL signals to set latch 110. The E signal as at the output of latch 110 is gated with the TAKE signal in NAND gate 128 to inhibit NAND gate 132 and the next A and B transistion of counter 88. In addition, the E signal is gate with A and B signal via NAND gate 126 to reset latch 98. This cycle is repeated for every pulse generated by unijunction oscillator 14. NAND gate 134 generates an output signal for each fourth pulse of crystal oscillator 12 for each fourth pulse of crystal oscillator 112 minus the pulses of unijunction oscillator 14. The signal at the output terminal of NAND gate 134 is divided by 128 in counter 136. The signal as at the output terminal of counter 136 is the low frequency which is shift frequency divided by 128 subtracted from the center frequency.

From the foregoing description it will be realized that crystal controlled variable frequency oscillator 10 provides an output signal having a center frequency determined by the crystal oscillator, and output signal having a high frequency which is the center frequency plus the shift frequency of the unijunction oscillator, and an output signal having a low frequency which is the center frequency minus the shift frequency. The output signals of crystal controlled variable frequency oscillator 10 are given by the following expressions wherein $F_o$ is the crystal oscillator frequency and $F_1$ is the shift frequency:

$$\text{Center frequency} = F_o/4/128$$

$$\text{High frequency} = F_o/4 + F_1/128$$

$$\text{Low frequency} = F_o/4 - F_1/128$$

Since certain changes may be made in the foregoing disclosure without departing from the scope of the invention herein involved, it is intened that all matter contained in the above description and depicted in the accompanying drawings be construed in an illustrative and not in a limiting sense.

What is claimed is:

1. A crystal controlled variable frequency oscillator comprising:

a. crystal oscillator means for generating a first signal of precise frequency;

b. shift oscillator means for generating a shift frequency signal; and c. logic means having input and output terminal means, said logic means input terminal means electrically connected to said crystal oscillator means and shift oscillator means for selectively combining said first and shift frequency signals, said first signal related to a center frequency, said logic means operating to selectively generate a stable frequency signal at a center frequency, at a high frequency and at a low frequency, said center frequency signal specified by said crystal oscillator frequency, said high and low frequency signals specified by adding and subtracting said shift frequency and center frequency, said stable frequency signal presented at said logic means output terminal means.

2. The crystal controlled variable frequency oscillator as claimed in claim 1 including counter means having input and output terminal means, said counter means input terminal means, connected to said crystal oscillator means, said counter means output terminal means selectively connected to said logic means, said counter means operating to generate high and low logic level signals for gating said logic means.

3. The crystal controlled variable oscillator as claimed in claim 2 wherein said shift oscillator means is unijunction transistor oscillator means.

4. A crystal controlled variable frequency oscillator comprising:

a. a crystal oscillator means for generating a first signal of precise frequency;

b. shift oscillator means for generating a shift frequency signal;

c. counter means operatively connected to said crystal oscillator means for generating second, third, fourth and fifth signals, said second and fourth being logical ones and said third and fifth signals being logical zeros, said fourth and fifth signals derived from said second and third signals, respectively; and d. gating means operatively connected to said shift oscillator means and said counter means for selectively combining said second, third, fourth, fifth and shift frequency signals and generating selected stable frequency signals.

5. The crystal controlled variable frequency oscillator as claimed in claim 4 wherein said shift oscillator means is a unijunction transistor oscillator.

6. The crystal controlled variable frequency oscillator as claimed in claim 4 wherein said counter means includes:

a. first divider means having at least one input terminal and first and second output terminals, said first divider means input terminal operatively connected to said crystal oscillator means, said second signal presented said first divider means first output terminal and said third signal presented said first divider means second output terminal; and b. second divider means having at least one input terminal and first and second output terminals, said first divider means first output terminal operatively connected to said second divider means input terminal, said fourth signal presented at said second divider means first output terminal and said fifth signal presented at said second divider means second output terminal.

7. The crystal controlled variable frequency oscillator as claimed in claim 4 wherein said gating means includes:

a. first latch means having input and output means, said first latch input means operatively connected to said shift oscillator means a sixth signal presented at said first latch output means;

b. second latch means having input and output means, said second latch input means operatively connected to said first latch output means, a seventh signal presented at said second latch output means;

c. means for generating a PUT signal;

d. means for generating a TAKE signal;

e. first NAND gate means having input and output means, said first NAND gate input means receiving said second, fifth seventh and PUT signals;

f. second NAND gate means having input and output means, said second NAND gate input means receiving said seventh and TAKE signals;

g. third NAND gate means having input and output means, said third NAND gate input means gated by a signal at said second NAND gate output means and by said second and fourth signals;

h. fourth NAND gate means having input and output means, said fourth NAND gate input means operatively connected to said first and third NAND gate output means;

i. fifth NAND gate means having input and output means, said fifth NAND gate input means gated by said first, third and fifth signals;

j. sixth NAND gate means having input and output means, said sixth NAND gate input means operatively connected to said first latch and fifth NAND gate output means; and k. seventh NAND gate means having input and output means, said seventh NAND gate gated by said second, fourth and seventh signals, said seventh NAND gate output means operatively connected to said first latch input means.

8. The crystal controlled variable frequency oscillator as claimed in claim 7 including third divider means having input and output means, said third divider input means operatively connected to said fourth NAND gate output means, said stable frequency signals presented at said third divider output means.

9. A crystal controlled variable frequency oscillator comprising:

a. a crystal oscillator means for generating a first signal of precise frequency;

b. shift oscillator means for generating a shift frequency signal;

c. counter means operatively connected to said crystal oscillator means for generating second, third, fourth and fifth signals, said second and fourth being logical ones and said third and fifth signals being logical zeros, said fourth and fifth signals derived from said second and thiRd signals, respectively;

d. first latch means having input and output means, said first latch input means operatively connected to said shift oscillator means a sixth signal presented at said first latch output means;

e. second latch means having input and output means, said second latch input means operatively connected to said first latch output means, a seventh signal presented at said second latch output means;

f. means for generating a PUT signal;

g. means for generating a TAKE signal;

h. first NAND gate means having input and output means, said first NAND gate input means receiving said second, fifth, seventh and PUT signals;

i. second NAND gate means having input and output means, said second NAND gate input means receiving said seventh and TAKE signals;

j. third NAND gate means having input and output means, said third NAND gate input means gated by a signal at said second NAND gate output means and by said second and fourth signals;

k. fourth NAND gate means having input and output means, said fourth NAND gate input means operatively connected to said first and third NAND gate output means;

l. fifth NAND gate means having input and output means, said fifth NAND gate input means gated by said first, third and fifth signals;

m. sixth NAND gate means having input and output means, said sixth NAND gate input means operatively connected to said first latch and fifth NAND gate output means; and n. seventh NAND gate means having input and output means, said seventh NAND gate gated by said second, fourth and seventh signals, said seventh NAND gate output means operatively connected to said first latch input means; and o. third divider means having input and output means, said third divider input means operatively connected to said fourth NAND gate output means, a stable frequency signal at a center frequency, at a high frequency and at a low frequency presented at said third divider output means, said center frequency specified by said crystal oscillator, said high and low frequency signals specified by adding and subtracting said shift frequency and center frequency.

10. The crystal controlled variable frequency oscillator as claimed in claim 9 including counter means operatively connected to said crystal oscillator means for generating second, third, fourth and fifth signals for controlling the frequency of said stable signal, said second and fourth being logical ones of said third and fifth signals being logical zeros, said fourth and fifth signals derived from said second and third signals, espectively.

* * * * *